(12) United States Patent
Miller et al.

(10) Patent No.: US 7,811,085 B2
(45) Date of Patent: Oct. 12, 2010

(54) GAS PREHEATER FOR CHEMICAL VAPOR PROCESSING FURNACE

(75) Inventors: Brian J. Miller, Mishawaka, IN (US);
Alan A. Arico, South Bend, IN (US);
Akshay Waghray, Granger, IN (US);
Todd M. Menzie, Granger, IN (US);
James Jay Cress, Mishawaka, IN (US)

(73) Assignee: Honeywell International Inc., Morristown, NJ (US)

( * ) Notice: Subject to any disclaimer, the term of this patent is extended or adjusted under 35 U.S.C. 154(b) by 1154 days.

(21) Appl. No.: 11/417,033

(22) Filed: May 4, 2006

(65) Prior Publication Data

US 2007/0256636 A1    Nov. 8, 2007

(51) Int. Cl.
F28F 27/02    (2006.01)

(52) U.S. Cl. .................. 432/212; 432/219; 432/224; 165/102; 165/139

(58) Field of Classification Search .......... 432/64, 432/130, 133, 136, 143, 150, 239, 247, 212, 432/219, 224; 118/715, 724; 165/8, 9, 10; 122/1 A
See application file for complete search history.

(56) References Cited

U.S. PATENT DOCUMENTS

| | | | |
|---|---|---|---|
| 5,480,678 A | 1/1996 | Rudolph et al. | |
| 6,109,209 A * | 8/2000 | Rudolph et al. | 118/724 |
| 6,162,298 A | 12/2000 | Rudolph | |
| 6,206,972 B1 | 3/2001 | Dunham | |
| 6,572,371 B1 | 6/2003 | Sion et al. | |
| 6,616,766 B2 | 9/2003 | Dunham | |
| 6,626,998 B1 | 9/2003 | Dunham | |
| 6,669,988 B2 | 12/2003 | Daws et al. | |
| 6,758,909 B2 | 7/2004 | Jonnalagadda et al. | |
| 6,846,514 B2 | 1/2005 | Jonnalagadda et al. | |
| 6,942,753 B2 | 9/2005 | Choi et al. | |
| 2004/0047990 A1* | 3/2004 | Daws et al. | 427/248.1 |
| 2004/0071877 A1* | 4/2004 | Goujard et al. | 427/255.28 |
| 2004/0211364 A1 | 10/2004 | Jonnalagadda et al. | |
| 2005/0223986 A1 | 10/2005 | Choi et al. | |
| 2005/0251990 A1 | 11/2005 | Choi et al. | |

* cited by examiner

*Primary Examiner*—Gregory A Wilson
(74) *Attorney, Agent, or Firm*—Shumaker & Sieffert, P.A.

(57) ABSTRACT

A gas preheater (10) that includes an exit plate (20) having first and second sides (22, 24) and a plurality of through holes (26) and at least one body (34) mounted adjacent the first side (22), the at least one body (34) having a first end (36) and a second end (38), the second end (38) located between the body first end (36) and the exit plate first side (22), at least one sidewall (40) connecting the first and second ends (36, 38), a body opening (42) in the first end (36) extending into the body (34) and defining a body inner wall (44), and a plurality of passages (46) extending between the at least one sidewall (40) and the body inner wall (44).

16 Claims, 5 Drawing Sheets

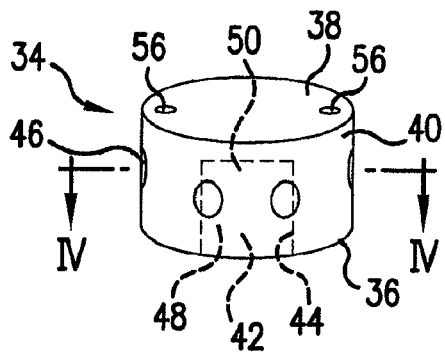
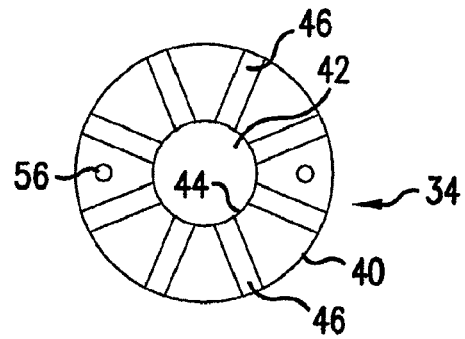
FIG.3   FIG.4
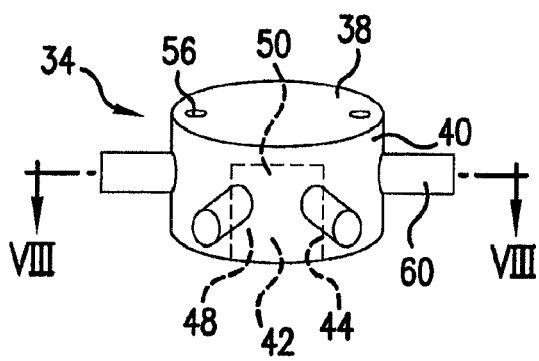
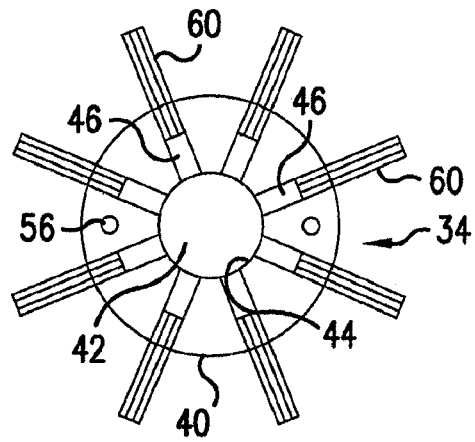
FIG.7   FIG.8
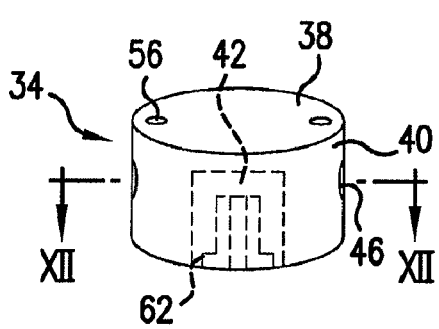
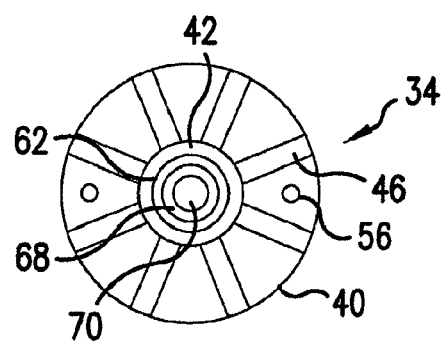
FIG.11   FIG.12

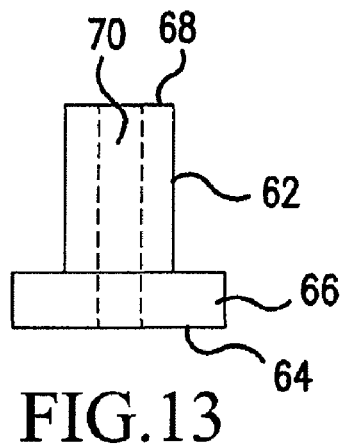
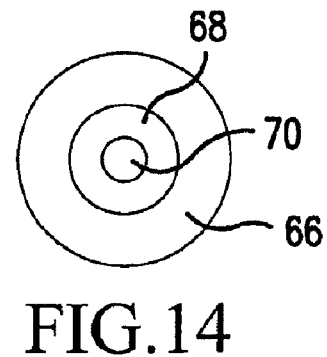
FIG.13  FIG.14
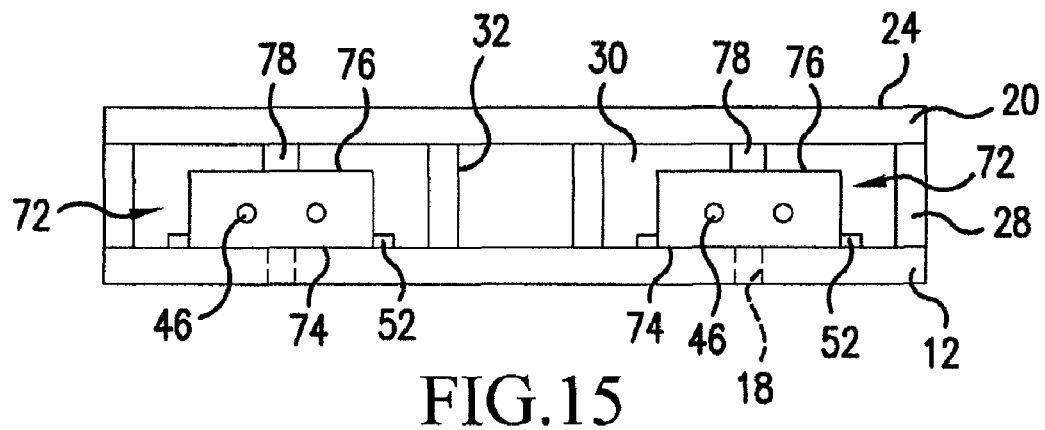
FIG.15
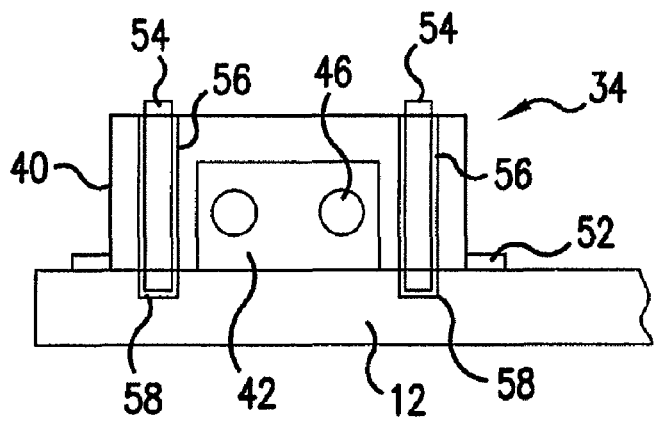
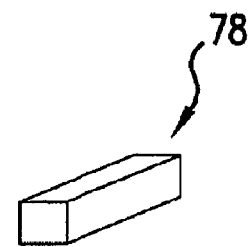
FIG.16  FIG.17

GAS PREHEATER FOR CHEMICAL VAPOR PROCESSING FURNACE

FIELD OF THE INVENTION

The present invention is directed toward a gas preheater for a chemical vapor processing furnace, and, more specifically, toward a gas preheater having an interior in which a plurality of bodies are mounted, the bodies receiving process gas from a gas source and distributing the gas beneath an exit plate having holes through which the gas exits and passes into a furnace.

BACKGROUND OF THE INVENTION

Furnaces for carrying out chemical vapor deposition (CVD) and/or chemical vapor infiltration (CVI) are well known and are discussed for example, in U.S. Pat. No. 6,162,298 to Rudolph, the entire contents of which is hereby incorporated by reference. In such furnaces, process gas is introduced into a lower portion of a furnace where it passes through a gas preheating system. There it is heated and distributed before it enters the processing portion of the furnace.

Conventional gas preheating systems generally occupy a relatively large part of the lower portion of a furnace, and this reduces the amount of space in the furnace for holding materials to be processed. If the thickness of such conventional preheaters is reduced, gases may not be heated and mixed to an adequate degree before entering the furnace. The thickness of the preheating system therefore represents a tradeoff between the amount of usable space inside the furnace taken up by the system and the ability of the preheating system to adequately preheat and distribute the gas before it is released into the furnace.

In addition, products to be processed in a CVD or CVI furnace are often placed or stacked on a pallet or other support for ease of handling, and this pallet with the products loaded thereon is then placed into the furnace. The height of the pallet further reduces the space available for products in the furnace.

It would therefore be desirable to provide a gas preheating system for a CVD/CVI furnace that preheats and distributes process gases in a satisfactory manner while taking up less space in a furnace than conventional gas preheaters, and, optionally, that can be used as a support or pallet for transferring work pieces to and from a furnace.

SUMMARY OF THE INVENTION

These problems and others are addressed by the present invention which comprises, in a first aspect, a gas preheater that includes an exit plate having first and second sides and a plurality of through holes and at least one body mounted adjacent the first side. The at least one body has a first end and a second end, the second end being located between the body first end and the exit plate first side, and at least one sidewall connecting the first and second ends. The body also includes a body opening in the first end extending into the body and defining a body inner wall, and a plurality of passages extending between the at least one sidewall and the body inner wall.

Another feature of the invention comprises a gas preheater that includes an exit plate having a plurality of exit holes, an entrance plate spaced from and connected to the exit plate and including a plurality of entrance holes and at least one preheater sidewall defining with the entrance plate and exit plate a preheater interior. The preheater also includes at least one body mounted in the interior having a first end supported by the entrance plate and a second end between the body first end and the exit plate. The body includes at least one sidewall connecting the first and second ends and a body opening in the first end extending into the body and defining a body inner wall. The body opening is aligned with one of the entrance holes, and a plurality of passages extend between the at least one sidewall and the body inner wall. The body opening has a passage portion and a second portion between the passage portion and the second wall, the passages being located in the passage portion.

BRIEF DESCRIPTION OF THE DRAWINGS

These aspects and features of the invention and others will be better understood after a reading of the following detailed description of embodiments of the invention together with the following drawings wherein:

FIG. 3 is a perspective view of one of the bodies of FIG. 1;

FIG. 4 is a sectional view taken along line IV-IV of FIG. 3;

FIG. 7 is a perspective view of one of the bodies of FIG. 5;

FIG. 8 is a sectional view taken along line VIII-VIII of FIG. 7;

FIG. 11 is a perspective view of one of the bodies of FIG. 9;

FIG. 12 is a sectional view taken along line XII-XII of FIG. 11;

FIG. 13 is a side elevation view of an insert used in the body illustrated in FIG. 9;

FIG. 14 is a top plan view of the insert of FIG. 13;

FIG. 15 is a side elevational view of two preheater bodies used with a spacer;

FIG. 16 illustrates pins for securing the bodies of the foregoing embodiments to the entrance plate; and FIG. 17 is a perspective view of the spacer illustrated in FIG. 15.

DETAILED DESCRIPTION

Figure 1:
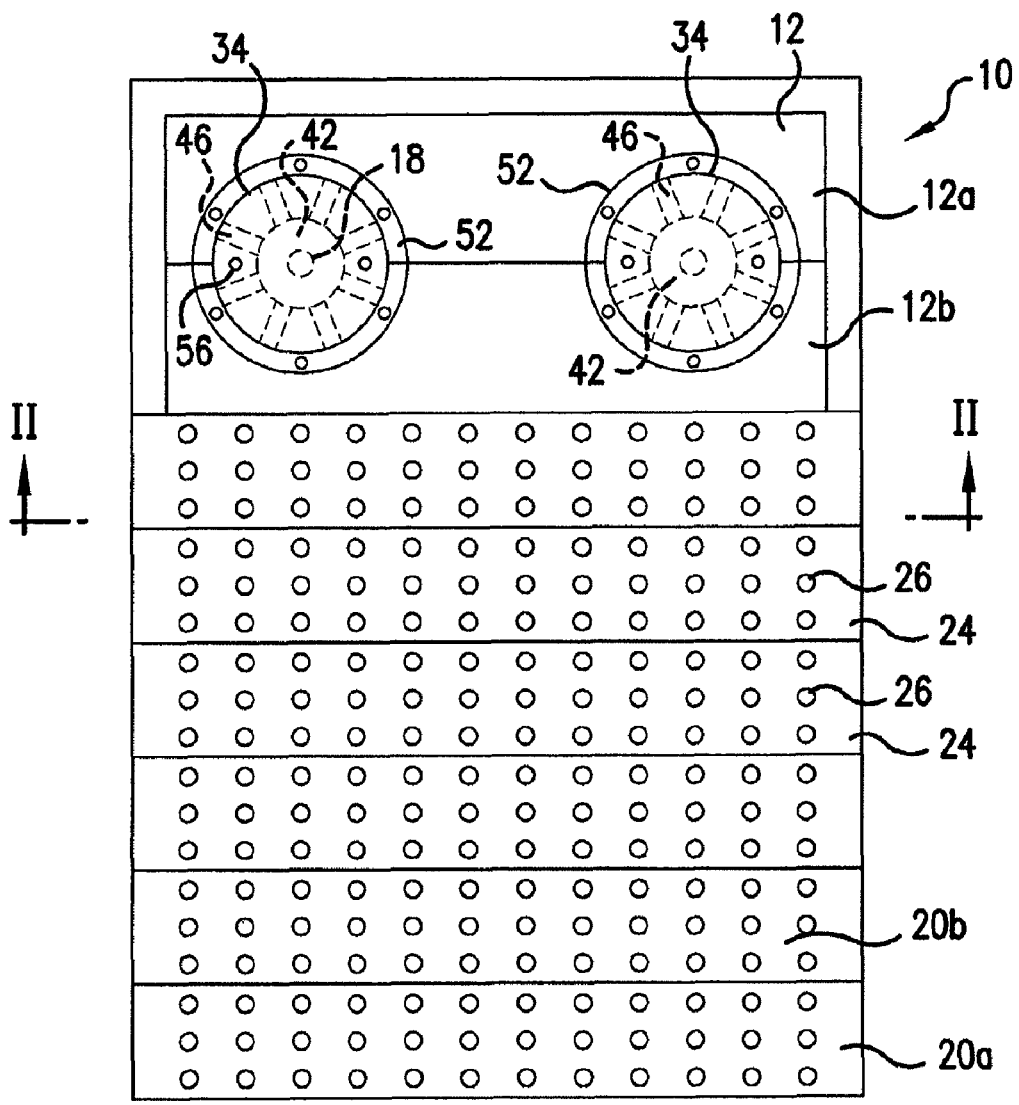
FIG. 1 is a top plan view of a gas preheater according to a first embodiment of the present invention having an entrance plate and an exit plate, a portion of the exit plate being removed to show the interior of the preheater, and a plurality of bodies in the preheater interior.

Referring now to the drawings, wherein the showings are for illustrating preferred embodiments of the invention only and not for the purpose of limiting same, FIG. 1 shows a gas preheater 10 comprising an entrance plate 12 having a first side 14, a second side 16 and a plurality of holes 18, an exit plate 20 having a first side 22, a second side 24 and a plurality of holes 26 arranged in an array, and a sidewall 28 spacing the exit plate 20 from the entrance plate 12. The entrance plate 12, exit plate 20 and sidewall 28 define a preheater interior 30. Entrance plate 12 and exit plate 20 are preferably formed from graphite or carbon-carbon composite to enable them to withstand the temperatures and conditions in a process furnace. These plates may comprise single sheets of material, or, as illustrated in FIG. 1, they may also be formed of several smaller sheets suitably secured together, by the sidewall 28, for example to simplify handling and assembly of the preheater. Thus, in the attached figures, entrance plate 12 comprises entrance plate segments 12a and 12b as well as similar plate segments that are not visible, and exit plate 20 comprises exit plate segments 20a, 20b, etc.

In use, gas preheater 10 will be placed into a process furnace (not shown) that has a plurality of gas outlets in the floor thereof. Holes 18 in entrance plate 12 will be aligned with these outlets to allow process gas to enter the preheater 10. After passing through bodies, described hereafter, in the preheater interior 30, the gas will exit the preheater 10 through the holes 26 in exit plate 20. The gas preheater 10 will generally be positioned with first side 14 of entrance plate 12 on a horizontal support in the furnace and with products stacked on second side 24 of exit plate 20 (or on other spacers (not shown) placed on the exit plate 20); therefore, the exit plate 20 may sometimes be described as being "above" the entrance plate 12. Various supports, 32, illustrated in FIG. 2, for example, help support exit plate 20 above the entrance plate 12.

Figure 2:
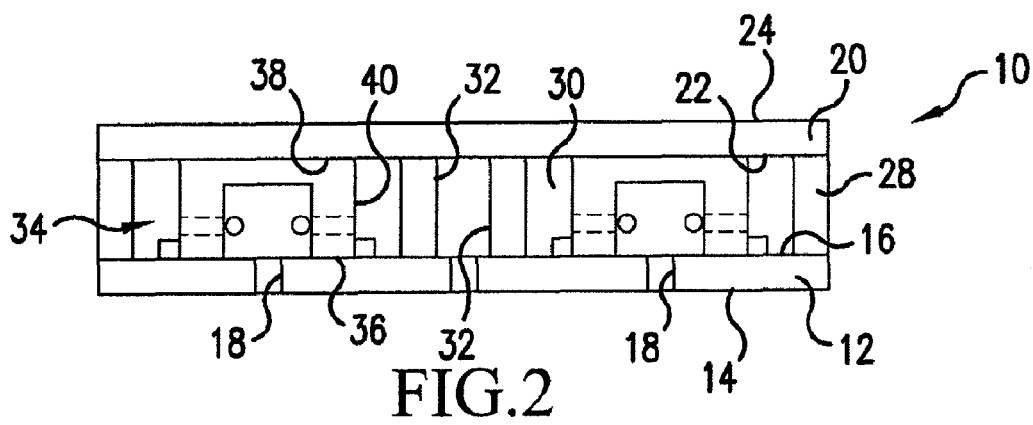
FIG. 2 is a sectional view taken in the direction of line II-II in FIG. 1.
Figure 5:
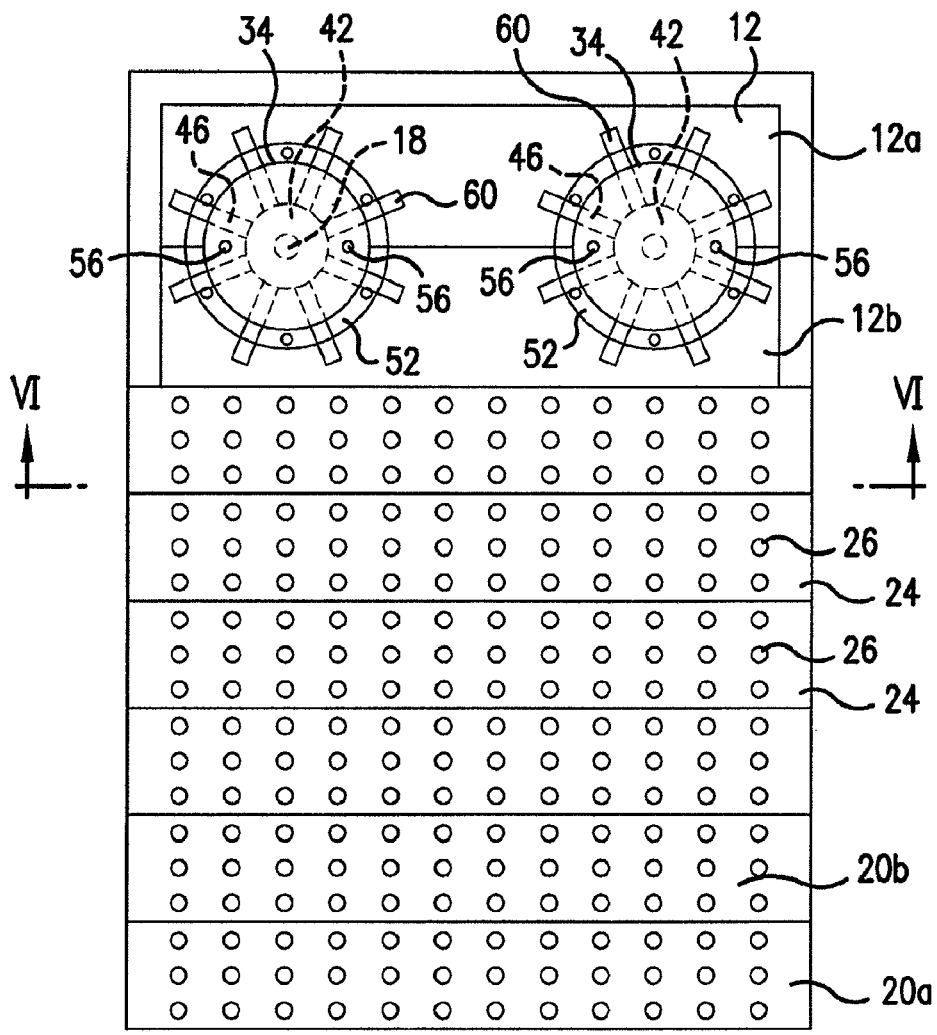
FIG. 5 is a top plan view a gas preheater according to a second embodiment of the present invention having an entrance plate and an exit plate, a portion of the exit plate being removed to show the interior of the preheater, and a plurality of bodies in the preheater interior.
Figure 6:
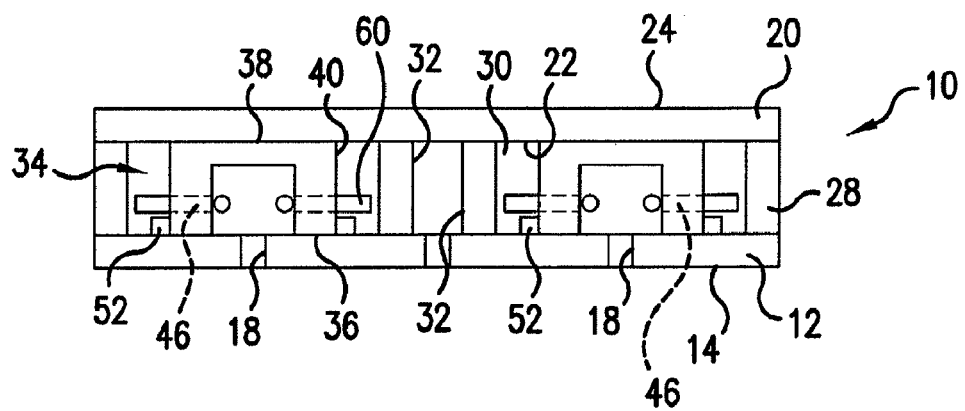
FIG. 6 is a sectional view taken in the direction of line VI-VI in FIG. 5.
Figure 9:
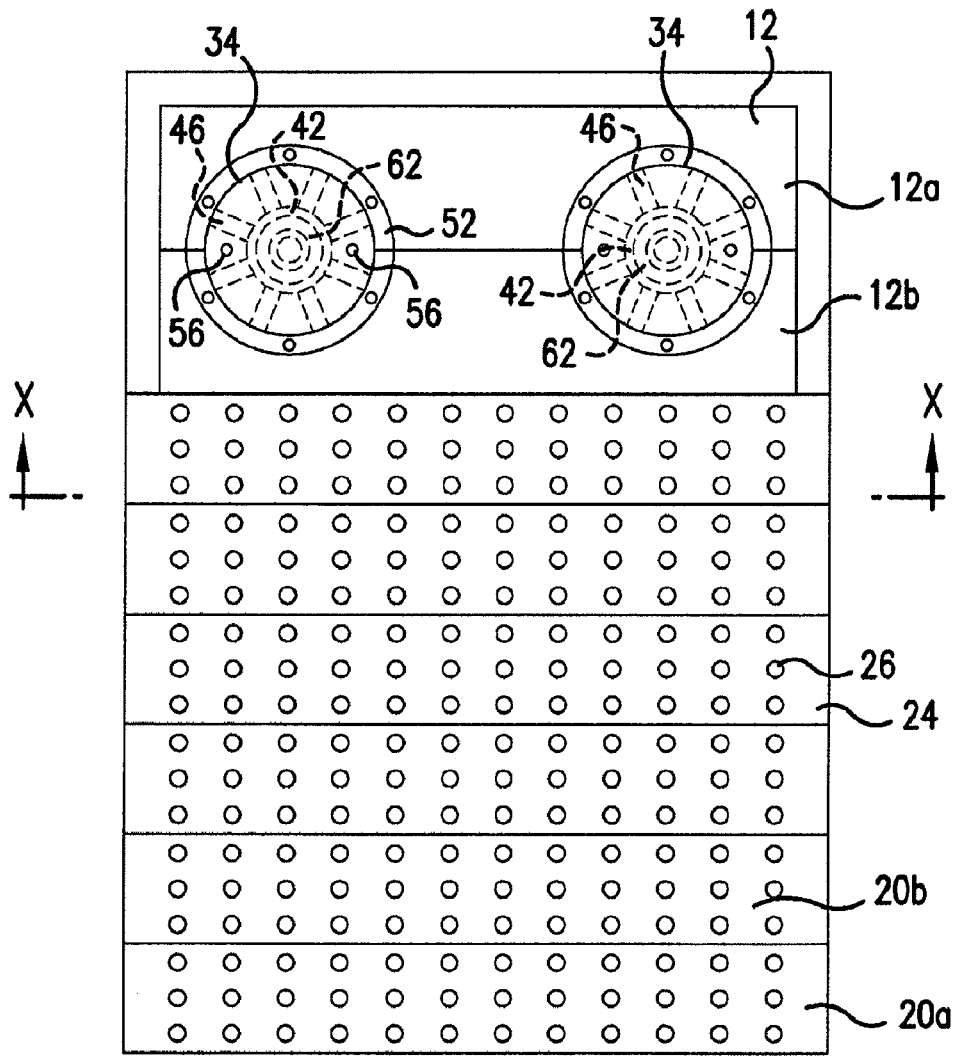
FIG. 9 is a top plan view a gas preheater according to a third embodiment of the present invention having an entrance plate and an exit plate, a portion of the exit plate being removed to show the interior of the preheater, and a plurality of bodies in the preheater interior.

Mounted in interior 30 are a plurality of bodies 34, two of which are visible in FIGS. 1 and 2; a total of eight of these bodies 34 are positioned in interior 30. Bodies 34, being in contact with both second side 16 of entrance plate 12 and first side 22 of exit plate 20, provide additional support for the exit plate 20. Each body 34 comprises a first end 36 supported by second side 16 of entrance plate 12 and a second end 38 disposed adjacent first side 22 of exit plate 20 and includes a sidewall 40 between the first and second ends. Body 34 includes a body opening 42 in body first end 36 which defines a body inner wall 44. Body 34 and body opening 42 in this embodiment are cylindrical but could have a square or other non-circular cross section without exceeding the scope of this invention. A plurality of passages 46 extend between body inner wall 44 and sidewall 40. The body opening 42 can be described as comprising a passage portion 48 which is the portion of the body opening 42 into which the passages 46 open and a second portion 50 located between passage portion 46 and the end of body opening 42 closest to body second end 38. Body openings 42 are aligned with holes 18 in entrance plate 12 so that process gases entering gas preheater 10 will pass through one of the bodies 34 before reaching interior 30.

Bodies 34 are surrounded by rings 52 which are secured to entrance plate 12 around holes 18 by bolting or in another conventional manner primarily to hold various portions of the entrance plates together. They may also, in some cases, help maintain the positions of bodies 34. Pins 54, illustrated in FIG. 16, are inserted into openings 56 in bodies 34 and extend into openings 58 in entrance plate 12 to substantially fix the location of bodies 34 relative to the entrance plate 12. These pins 54 may be used with the bodies of any of the embodiments disclosed herein; however, for clarity of illustration, the pins 54 and openings 56 are not illustrated in all figures.

As will be appreciated from FIGS. 3 and 4, bodies 34 of this embodiment include eight passages 46 evenly circumferentially distributed around body sidewall 40. Furthermore, body opening 42 has a diameter approximately one-half the diameter of body 34. This provides sufficient space for gas flow within body 34 as discussed hereafter while providing body 34 with sufficient mass to retain heat for heating process gas passing through the body 34. In addition, as illustrated in FIG. 1, passages 46 of bodies 34 are in this embodiment arranged so that they are not normal to the sidewall 28 of the gas preheater 10 and also not aligned with the passages 46 of adjacent bodies 34. This arrangement helps provide good mixing of gases exiting from each of the bodies 34 to help equalize gas temperatures and thoroughly mix various process gases before these gases enter the furnace through holes 26 in exit plate 20.

In use, one or more products to be processed in a furnace are placed or stacked on preheater 10, and preheater 10 is placed into the interior of a furnace with first side 14 of entrance plate 12 resting on the floor of the furnace with holes 18 aligned with gas outlet openings in the furnace floor. Alternately, the preheater could be mounted in a more permanent manner in the interior of the furnace and products could be placed on the preheater 10 without removing preheater 10 from the furnace. However, gas preheater 10 of this embodiment is configured to have sufficient strength and rigidity to allow it to be moved into and removed from the furnace as needed. The interior of the furnace is heated in a conventional manner, which heats gas preheater 10 including bodies 34. When the interior of the furnace has been heated to a required temperature, process gas is introduced into the gas preheater 10 though holes 18. This gas fills the body openings 42 of the bodies 34 and absorbs heat from bodies 34. The gas then passes through passages 46 of bodies 34 where it is heated further by contact with the walls of the passages 46. After exiting bodies 34, the gases are heated still further by the heat radiated from sidewall 28 and entrance and exit plates 12, 20. The mixed and preheated gas then passes though holes 26 in exit plate 20 and enters the furnace. Computer models suggest that this arrangement will provide acceptable preheating and distribution of gas with a thinner preheater than has heretofore been possible.

FIGS. 5-8 illustrate a second embodiment of the present invention in which elements common to the first embodiment are identified by like reference numerals. This embodiment of the invention differs from the embodiment of FIGS. 1-4 in that bodies 34 include tubes 60 projecting from passages 46. These tubes may be formed integrally with bodies 34 or be attached to body sidewall 40, but in the present embodiment comprise separate elements that project into passages 46, as shown in FIG. 8, and are secured therein with a suitable adhesive (not shown). Tubes 60 increase the heated surface area that process gas must contact as it travels from holes 18 in entrance plate 12 to the interior 30 of gas preheater 10 and thus these tubes provide additional heating for the process gases. In addition, tubes 60 may increase the resistance to gas flow from body opening 42 to interior 30 and thus increase the time that some gases spend in body opening 42.

Figure 10:
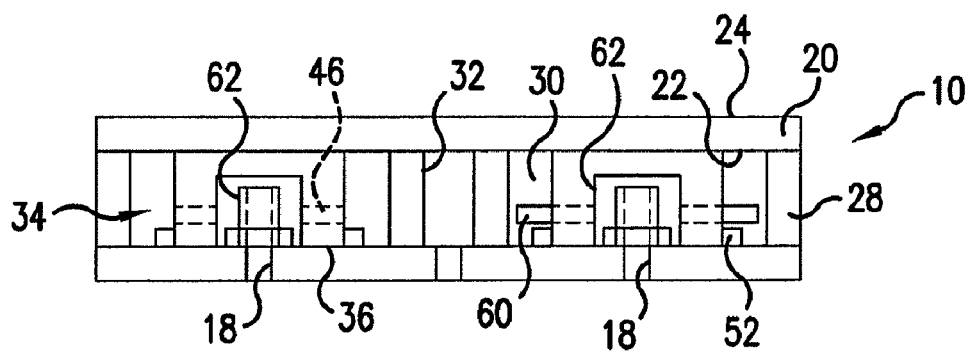
FIG. 10 is a sectional view taken in the direction of line X-X in FIG. 9.

FIGS. 9-14 are directed to a third embodiment of the present invention in which elements common to the first two embodiments are identified by like reference numerals. In this embodiment, an insert 62 is placed on second side 16 of entrance plate 12 over one of holes 18 in entrance plate 12 so that insert 62 extends into body opening 42 of body 34 when body 34 is placed over opening 18. As illustrated in FIGS. 13 and 14, insert 62 includes a first end 64 including a flange 66 on which the insert 62 rests when placed on a support surface, a second end 68 and an insert opening 70 extending between first end 64 and second end 68. Insert opening 70 has a diameter at least as large as the diameter of hole 18 over which it is placed so as not to interfere with the flow of process gas out of hole 18. Preferably, the diameter of flange 66 is selected so that insert 62 will be loosely retained in body opening 44 without covering opening 18. As illustrated in FIG. 10, insert 62 can be used with a body 34 whether or not body 34 includes tubes 60.

Insert 62 provides additional preheating for process gases in two ways. First, the insert itself will be heated by the furnace and will heat process gases contacting the inner wall of insert opening 70 as the gas passes through the insert 62. Next, the insert 62 lengthens the path that the process gas must traverse in passing from opening 18 to interior 30 of gas preheater 10. The distance between insert first end 64 and insert second end 68 is selected relative to the size of body opening 42 so that insert second end 68 is located in second portion 50 of body opening 42 when the insert 62 and body 34 are both supported on second side 16 of entrance plate 12. In this manner, gas exiting second end 68 will have to travel between the body inner wall 44 of body 34 and the outer wall of insert 62 and will absorb additional heat before exiting the body 34.

An alternate body 72 is illustrated in FIG. 15, which body 72 may be used in place of previously discussed body 34 with or without tubes and/or with or without an insert. Body 72 has a first end 74 and a second end 76 that are closer together than the first and second ends of body 34. As discussed above, bodies 34, in addition to supports 32, help support exit plate 20 above entrance plate 12. When a body such as body 72 is used, therefore, it may be desirable to provide spacers 78 that rest atop bodies 72. Spacers 78 have a thickness equal to the distance between the second end 76 of body 72 and the first side 22 of exit plate 20 when body 72 is supported by entrance plate 12. Spacer 78 is preferably formed out of graphite or a carbon-carbon material as are bodies 34 and 72.

The present invention has been described herein in terms of several preferred embodiments. However, obvious modifications and additions to these embodiments will become apparent to those skilled in the relevant arts upon a reading of the foregoing description. It is intended that all such modifications and additions form a part of the present invention to the extent that they fall within the scope of the several claims appended hereto.

We claim:

1. A gas preheater comprising:
   an exit plate having first and second sides and a plurality of through holes;
   at least one body mounted adjacent said first side, said at least one body having a first end and a second end, said second end located between said body first end and said exit plate first side, at least one sidewall connecting said first and second ends, a body opening in said first end extending into said body and defining a body inner wall, and a plurality of passages extending between said at least one sidewall and said body inner wall;
   an entrance plate connected to said exit plate and supporting said body adjacent to said exit plate;
   at least one preheater sidewall connecting said entrance plate and said exit plate and defining with the entrance plate and the exit plate a preheater interior, said entrance plate including at least one hole aligned with the body opening of the at least one body; and
   an insert supported in said body opening by said entrance plate, said insert comprising an insert body having a first end and a second end and an insert opening extending from said first end to said second end.

2. The gas preheater of claim 1 wherein said body is cylindrical and said body opening has a circular cross section.

3. The gas preheater of claim 2 wherein a diameter of the body opening is about one half the diameter of the cylindrical body.

4. The gas preheater of claim 1 including a plurality of tubes projecting from said plurality of passages away from said body opening.

5. The gas preheater of claim 4 wherein said body opening includes a passage portion and a second portion, said passage portion located between said second portion and said first end, said passages being located in said passage portion, and wherein said insert second end extends into said body opening second portion.

6. The gas preheater of claim 5 including a plurality of tubes projecting from said plurality of passages away from said body opening.

7. The gas preheater of claim 5 wherein said insert includes a flange at said insert first end for stabilizing said insert on said entrance plate.

8. The gas preheater of claim 1 wherein said entrance plate includes a raised wall surrounding each hole in said entrance plate.

9. The gas preheater of claim 1 wherein said entrance plate is spaced from said exit plate by a first distance, said body has a length from said first end to said second end less than said first distance, and including a spacer on said body second end having a thickness equal to the difference between said first distance and said body length.

10. The gas preheater of claim 1 wherein said body includes first and second through openings connecting said first end and second end and pins extending through said first and second through openings into openings in said entrance plate.

11. The gas preheater of claim 1 wherein said through holes in said exit plate are arranged in a regular array.

12. The gas preheater of claim 1 including supports between said entrance plate and said exit plate, said supports, exit plate and entrance plate being configured to support the weight of a load of products stacked on said exit plate.

13. A gas preheater comprising:
    an exit plate having a plurality of exit holes;
    an entrance plate spaced from and connected to said exit plate and including a plurality of entrance holes;
    at least one preheater sidewall defining with said entrance plate and exit plate a preheater interior;
    at least one body mounted in said preheater interior and having a first end supported by said entrance plate and a second end between said body first end and said exit plate, at least one sidewall connecting said first and second ends, a body opening in said first end extending into said body and defining a body inner wall, said body opening being aligned with one of said entrance holes, and a plurality of passages extending between said at least one sidewall and said body inner wall, said body opening having a passage portion and a second portion between said passage portion and said second wall, said passages being located in said passage portion; and
    an insert supported in said body opening by said entrance plate, said insert comprising an insert body having a first end and a second end and an insert opening extending from said first end to said second end, said insert second end projecting into said body opening second portion.

14. The gas preheater of claim 13 including a plurality of tubes projecting from said plurality of passages away from said body opening.

15. A gas preheater comprising:
    an exit plate having first and second sides and a plurality of through holes;
    at least one body mounted adjacent said first side, said at least one body having a first end and a second end, said second end located between said body first end and said exit plate first side, at least one sidewall connecting said first and second ends, a body opening in said first end extending into said body and defining a body inner wall, and a plurality of passages extending between said at least one sidewall and said body inner wall; and
    an entrance plate connected to said exit plate and supporting said body adjacent to said exit plate, wherein
    said body includes first and second through openings connecting said first end and second end and pins extending through said first and second through openings into openings in said entrance plate.

16. The gas preheater of claim 15 including a plurality of tubes projecting from said plurality of passages away from said body opening.

* * * * *